United States Patent [19]
Schmidt et al.

[11] Patent Number: 5,698,299
[45] Date of Patent: Dec. 16, 1997

[54] THIN LAMINATED MICROSTRUCTURE WITH PRECISELY ALIGNED OPENINGS

[75] Inventors: Walter Schmidt, Zürich; Marco Martinelli, Neftenbach; Alexandra Frei, Winterthur, all of Switzerland

[73] Assignee: Dyconex Patente AG, Zug, Switzerland

[21] Appl. No.: 437,375

[22] Filed: May 9, 1995

Related U.S. Application Data

[63] Continuation-in-part of Ser. No. 949,487, Oct. 26, 1992, abandoned.

[30] Foreign Application Priority Data

Feb. 28, 1991 [CH] Switzerland ............... 0612/91
Feb. 18, 1992 [CH] Switzerland ............... 0477/92

[51] Int. Cl.⁶ ...................................... B32B 9/00
[52] U.S. Cl. .................... 428/209; 428/198; 29/852; 216/24; 216/67; 216/18; 216/51
[58] Field of Search ...................... 156/643, 644, 156/659.1, 668, 902; 29/852; 428/209, 198

[56] References Cited

U.S. PATENT DOCUMENTS

| | | | |
|---|---|---|---|
| 3,265,546 | 8/1966 | Medford | 156/3 |
| 3,812,972 | 5/1974 | Rosenblum | 210/489 |
| 4,788,766 | 12/1988 | Burger et al. | 29/830 |
| 4,834,835 | 5/1989 | Cziep et al. | 156/643 |
| 4,871,418 | 10/1989 | Wittlinger et al. | 156/643 |
| 4,889,585 | 12/1989 | Leyden | 156/630 |

FOREIGN PATENT DOCUMENTS

| | | |
|---|---|---|
| 1398082 | 3/1965 | France. |
| 2117172 | 7/1972 | France. |
| 38 16 078 | 11/1989 | Germany. |

*Primary Examiner*—Patrick Ryan
*Assistant Examiner*—Cathy K. Lee
*Attorney, Agent, or Firm*—Walter C. Farley

[57] ABSTRACT

A multilayer laminated body has a determinate system of hollow passages and is formed by an assembly of flat layers of polymeric materials having major dimensions in orthogonal X and Y directions and a thickness dimension in a Z direction perpendicular to the X and Y directions. Selected ones of the layers have openings extending through in the Z direction, and other layers have canals formed in an X-Y plane. The openings and canals form parts of hollow passages so that assembly of multiple layers joins openings and canals forms complete and continuous passages through the assembled layers. Layers joined in pre-laminate assemblies are assembled together in precise relative positions for desired alignment of the canals and openings. The passages can be filled with optically conductive material or electrically conductive material and electrodes can be appropriately positioned for acting on fluids passing through the body.

13 Claims, 7 Drawing Sheets

THIN LAMINATED MICROSTRUCTURE WITH PRECISELY ALIGNED OPENINGS

CROSS-REFERENCE TO RELATED APPLICATION

This is a continuation-in-part of application Ser. No. 07/949,487 filed Oct. 26, 1992, now abandoned.

FIELD OF THE INVENTION

This invention relates to a thin microstructure having laminated layers in which openings through the structure are made to follow desired paths in three dimensions and in which the openings are precisely aligned so that, despite the very small size, communication through the body of the structure in a desired manner is achieved, and to a method for making such a structure.

BACKGROUND OF THE INVENTION

It is known to create layered or laminated bodies having specific arrangements of conductor patterns on opposite sides of an insulating layer and, in some cases, with connections through the insulating layer. It is also known to form laminated bodies having "chemically drilled" holes, i.e., holes which are made by etching processes through one or more of the layers.

For the production of circuit boards from flexible films of different plastics materials, which is becoming increasingly common in the electronics industry, it is important to make very small holes at precisely predetermined locations. Conductive coatings can be added to these holes to form interconnections. It is also adequate for some purposes to make small holes mechanically, using mechanical drilling or punching with fine needles. However, the mechanical techniques have definite lower limits in hole size, in the order of a few tenths of millimeters, and quite often require mechanical steps which add to processing time and cost.

Indeed, the mechanical punching or drilling of holes in films is very complicated from the technical standpoint. With either drilling or punching, burrs result which interfere with further processing or machining. The cost of a punching tool with the necessary accuracy is very high and yet mechanical drilling is generally very slow, even when several films can be drilled together, because it is generally necessary to drill individual holes in succession.

SUMMARY OF THE INVENTION

An object of the present invention is to provide a structure which is laminated and can have a selected sequence of insulating and electrically conductive layers and which also has passages or openings formed in selected layers so that conduits are formed therein.

Another object is to provide such a structure which is very thin and has very small passages.

A further object is to provide a method for making such a structure.

BRIEF DESCRIPTION OF THE DRAWINGS

The invention is described in greater detail hereinafter with reference to the following drawings wherein.

DESCRIPTION OF THE PREFERRED EMBODIMENTS

Figure 1A:
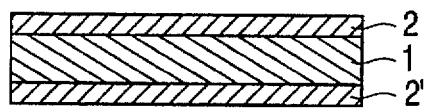
FIGS. 1a–1f and 2a–2f are schematic sectional views through a laminated structure showing methods for perforating a plastic film having coatings on its opposite surfaces.
Figure 2A:
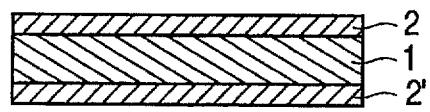

The term "determinate microscreen" as used herein means a flat object with a large number of passages having a selected one of a variety of shapes and directions. The term "determinate composite" is used herein to mean a system or assembly of a plurality of stacked microscreens containing a precisely guiding arrangement of conduits. This exact arrangement of conduits can be formed from tubular webs, i.e., hollow passages, or solid webs for conducting a particular kind of energy, or a mixture of both. The exact arrangement in the screen, either individually or in conjunction with additional screens, is also important if such a determinate screen is to cooperate with another flat object having its own exact raster (extrinsic raster). An example is a determinate light raster or louvre, formed by the determinate screen, which permits the passage of light a consequently forms a specific pattern of spots of light which are to act at specific points of another raster such as for LCD back-lighting. The very closely juxtaposed passages in the screen can also be important if it is necessary to guide materials in spatially close interaction in a given order, such as when producing filaments from a large number of microfibers or cold filaments, analogous to the passage of a gossamer thread from a spider.

The two examples above, chosen from many possible examples, show that it is desirable to have a material which is suitable for the passage of fluid materials or relatively material-free forms of energy such as light (photons), electromagnetic energy, electrons or the like, the passage taking place in a specific, determinate manner. This permits checking and control possibilities in dimensional ranges which can be called microranges, of which more will be said later.

It is clear that none of the known methods is suitable for producing a microscreen in accordance with the invention. The smaller the passage point through a material is to be, and the more precise it needs to be as to the opening cross-section, the shorter must be the height of the passage path. Thus, the determinate arrangement (which can be in either a uniform or non-uniform pattern but always determinate) must be made in a thin, flat structure, typically in a film. Using films it is possible to produce such "ordering screens" in a certain manner. Longer passage paths are obtained by subsequently joining plural microscreens to form an assembly.

In order to obtain the necessary accuracy, a film used for the method and apparatus described herein must be stabilized against distortion during manufacture and use, that the introduction of the passages takes place in the absence of mechanical forces and that, independently of the degree of fineness (passages per unit surface area) the desired determinacy is always maintained, i.e., the precision of the structure is invariant.

This is achieved in the following way. A film with a thickness of about 30 to 50µ (microns) is laminated on both sides with a suitable coating, in this case a metal coating, having a thickness of about 7 to 10µ. A metal coating has a stabilizing effect as to small tensile stresses and, within its elastic limit, restores the structure after deformation to its original state. It will be apparent that very fine structures are involved in this field of microtechnology in which the scale for processing or machining stress is quite different from that in conventional macroscopic working methods. In addition, the precision of imaging methods is assisted by very thin films because such films adapt closely to a (usually) thicker film with a pattern of microstructures to be transferred and, consequently, there is no offset. If copper is used as the metal coating, it can simultaneously serve as an etch resist. Thin plastic films with metal coating are commercially available. For some purposes, it may be necessary to produce films with a special coating, but it will normally be possible to select a suitable commercial product.

As previously mentioned, "serial" processes are not suitable for various reasons. In simultaneously acting processes, it is not possible, because of the required precision, to use wet etching processes because of the pronounced underetching which might not be disadvantageous in a macro procedure. Therefore, the present invention uses a plasma etching process which fulfills all of the requirements imposed. Such films could also be produced by a laser method, but because of the number of passages, it would scarcely be possible to use such a rapid serial procedure as is known in connection with laser cutting. The simultaneous procedures are therefore the optimum choice for the present invention.

The production of determinate multilayer screens, which ultimately leads to the determinate assemblies or diaphragms, falls within the field of microtechnology. Thus, if in a package of several such films, there are metal coatings (inorganic material) and plastic coatings (organic material) in alternating sequence, then reciprocally displaced rasters with passages in the Z direction can be connected in the X and Y directions by conduits in the form of channels, conductors or the like, which reveals the necessity for high precision and determinacy of the raster. In this context, the X and Y directions are measured in the longitudinal and transverse dimensions of a film or coating, those dimensions which define the major surfaces of a thin film, while the Z direction is the dimension of thickness, perpendicular to X and Y. As a function of how the fluids or energy transmissions are to act, the finished individual coatings can be provided with special coatings of a protective or process-facilitating nature. For transmission of fluids, for example, the coatings can be vacuum deposited with gold.

A tubular system of hollow conduits can then be conditioned with special substances, such as biologically active substances of which small peptides such as penta- to dodeca-peptides (for surface action) are an example. A fluid from which specific molecules or ions are to be removed, or to which they are to be added, can then be passed through the system. In a subsequent step, the system is then washed out. An important reason for using a determinate tubular system is that the determinate system can be grouped for the supply and removal of fluids which makes it possible to produce a network of microvessels, such as also occurs in nature, and which can be connected for cycles such as mentioned above.

This provides fluid guides in a microfield which could previously be done only macroscopically, with tubes. It is now known that structures in nature which were previously considered to be un-ordered are, in fact, highly determinate structures. In this connection, consider artificial kidneys and dialysis machines which are really macroscopic washing systems without any similarity to the actual functions of a kidney and are, in fact, not even functionally similar. However, there are numerous other functions in the micro field which can be simulated by structures made by the method according to the invention.

A tubular system using the present invention can also be used in analytic chemistry as an alternating and/or recycling indicator (loading, separating, eluting, measuring, etc.); in physical and chemical research for isolating rare substances; and it can also be used, somewhat surprisingly, in highly complex, microfine circuit boards. Considering such a tubular system, it is seen to be constituted by channels which lead through passages in walls to further channels. Tubes are cavities for carrying fluids. However, when considering the negative thereof, in place of channels there are solid webs which can also be passed through partitions to connect them to additional solid webs. If such solid webs are made of metal, then they can conduct electrical current and become conducting paths; if they are made of a light-transparent material, they can conduct light and become light guides. Thus, a determinate tubular system has led to a determinate conductor system. Thus, the method of the invention is also suitable for producing complex circuit boards in a micro-construction with high conductor density and very thin multilayers. Hybrid light guiding means can also be produced.

It can be seen that the technology for determinate micro-screens and diaphragms, which are more complex conduit systems, has an increasingly large number of applications and, at present, it cannot be foreseen where this will end. However, it is already possible to provide an adequate teaching for positive and negative methods, i.e., tubular or cavity structures and conductor or solid web means, so that both kinds of systems can be produced.

To perforate plastic film which, for functional reasons, must be coated on both sides with metal such as is typical of circuit boards in the electronics industry, a chemical hole production method can be used. The metal coatings applied to both sides of the plastic film are used, as an etch resist. The term "etch resist" means a substance which is resistant to the etching medium or, at least, is much more resistant than the material to be etched.

If etching is used, a wet process is possible, but this is not used in the present invention for the reasons given above in that it does not provide the necessary precision. Instead, an etching technique is used in which the etching medium is gaseous, namely plasma etching. It is also possible to use combinations of these methods. However, in all etching methods it is generally necessary to ensure that those parts which are not to be etched away are protected by an etch resist coating. Etching methods have the advantage that a large number of openings can be simultaneously etched from a film.

The precision of this method is determined by the precision of the structuring of the etch resist coating and the thickness of the plastic film to be etched. In this context, "structuring" refers to the formation of the pattern of protected and unprotected areas on the surface of the material to be etched. If, as is known in the electronics industry, use is made of photochemical structuring and a photoresist constitutes the etch resist for window openings in the metal coating, then it is easily possible to produce through-holes or passages with diameters of 10 to 100 μm (micro-meters). Thus, etching methods have the advantage that the holes can be made much smaller than with mechanical means. It is also possible to obtain through-holes with larger diameters or with variable non-circular and non-symmetrical contours. For large holes, not all of the material need be etched out. It is sufficient to merely cut through the edges after which the centers drop out.

Plasma etching also has the advantage that anisotropic, i.e., directional, etching can be done which largely prevents underetching. Underetching normally constitutes an undesired etching out below the etch resist, i.e., underetching of a hole usually manifests itself as lateral etching relative to the axis of the hole, under the surface resist layer. Also, plasma etching installations can be designed so that it is possible to process plastic film as it is transported from one roll to another.

If screen openings are required in a plastic film without a metal coating, the film can be temporarily metallized by vacuum deposition of a metal coating which can be etched away after the film is perforated.

In another variation, with a suitable combination of film material and photoresist for the structuring, the actual photoresist can be used as the etch resist for producing holes so that one process step can be saved. If the photoresist is also attacked by the etching medium, the removal from the photoresist must take place more slowly than the removal of the film material so that, once perforation has taken place, there still remains a residue of the photoresist or etch resist on the surface. If necessary, the residue can be stripped off using known methods.

FIGS. 1a to 1f and 2a to 2f show different stages of a process for perforating a plastic film having metal coatings on both sides. As the perforation takes place with the same process steps, the individual steps will essentially only be clarified relative to FIGS. 1a–1f. The figures are not to scale and generally are exaggerated in the dimensions of thickness.

FIG. 1a shows a coated plastic film 1 of, for example, 25 μm thick polyimide. Film 1 is coated on both sides with a metal such as copper, the metal coating 2, 2' having a thickness of 12 μm. Such metal coatings can be applied by a known electrolytic process, by laminating or by sputtering.

Figure 1B:
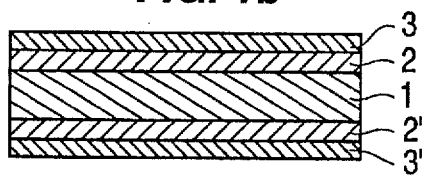
Figure 2B:
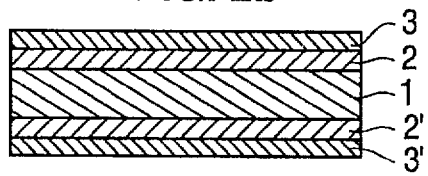

FIG. 1b shows the plastic film following the application of photoresist coatings 3 and 3' to the exposed surfaces of metal coatings 2 and 2' respectively. The photoresist coatings can be applied in a known manner such as using a roller coater and a continuous furnace.

Figure 1C:
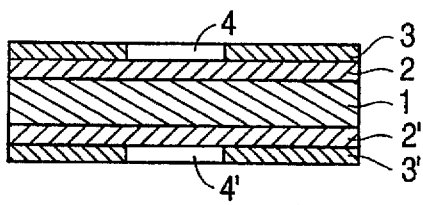
Figure 2C:
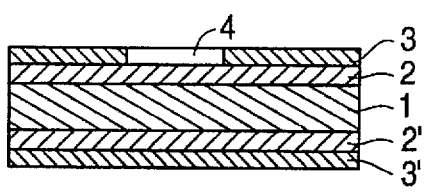

In FIG. 1c, photoresist coatings 3 and 3' have been exposed and developed, leaving the photoresist with the desired hole pattern. In that process, the photoresist coatings are exposed to the hole pattern using photographic originals applied to the coatings in the form of films or etched metal masks, after which development takes place. The coatings are left with recesses such as 4 and 4' at those points where holes are to be formed. Plastic film 1 must frequently be provided with through-holes or passages 5 and, for this purpose, identically shaped recesses 4 and 4' are formed in coatings 3 and 3' at points directly opposite each other. The formation of these recesses can take place simultaneously.

In other applications, holes 6 (FIG. 2f) are made in the plastic film such that the holes extend from one side through the metal coating and the plastic film but not through the metal coating on the opposite side. In this case, no opening equivalent to recess 4' is made, the sequence being shown in FIGS. 2c–2f.

Figure 1D:
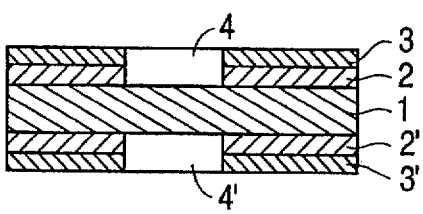
Figure 2D:
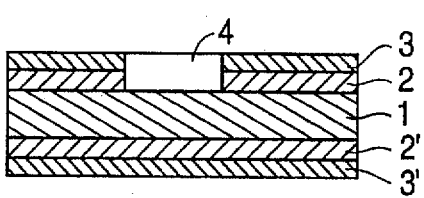
Figure 1E:
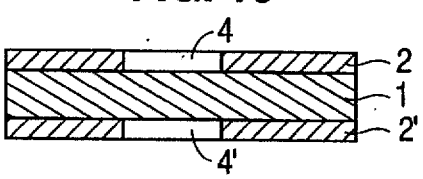
Figure 2E:
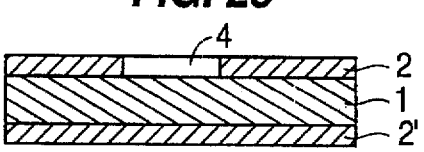

FIG. 1d shows the film after metal etching has taken place. In the etching process, metal coatings 2, 2' are etched on plastic film 1 using conventional etching media as used in circuit board technology. Metal coatings 2 and 2' are provided with recesses 4 and/or 4' at those points where passages 5 or holes 6 are to be formed. The purpose of process steps shown in FIGS. 1a–1f and 2a–2f is to expose the two-sided coated film at precisely those points where the passages or holes are to be formed. Holes 5 and 6 can then be made after this stage. FIG. 1e shows the structure after the no longer required photoresist coatings 3, 3' have been removed. This removal can also be by a conventional process, typically by using a photoresist stripper. Plastic film 1 then has a structured or patterned metal coating on both sides, corresponding to the hole pattern and serving as an etch resist for subsequent hole etching.

Figure 1F:
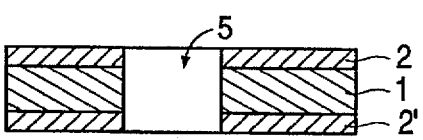
Figure 2F:
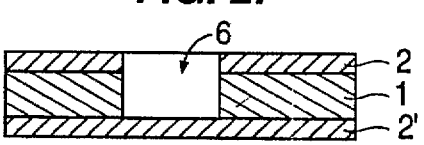

In FIG. 1f, passages 5 have been etched into the plastic by wet etching or plasma etching. In this way, burr-free holes 5 or 6 are obtained. If anisotropic (directional) plasma etching is used, the etching is accomplished without underetching. It is also possible to precede the plasma etching process by a step of treatment in a solution, not shown, for reducing the plasma etching time.

From the foregoing sequence, it will be clear that passages 5 and holes 6, which can be made from either side, can be produced in the same operation and on the same metal-coated plastic film.

After perforation has taken place, the copper-coated film 1 of, for example, polyimide, can be copper plated in a plating shop using known circuit board technology procedures, resulting in the simultaneous formation of interfacial connections of the metal coatings.

FIGS. 3a to 3d show stages of a process for perforating a plastic film 1 of polyimide provided with photoresist on both sides. The film alone is shown in FIG. 1a.

Figure 3A:
FIGS. 3a–3d show a method for perforating an uncoated film using photoresist.
Figure 3B:
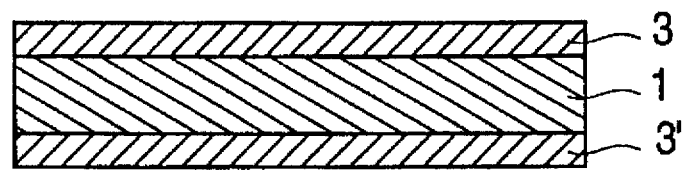
Figure 3C:
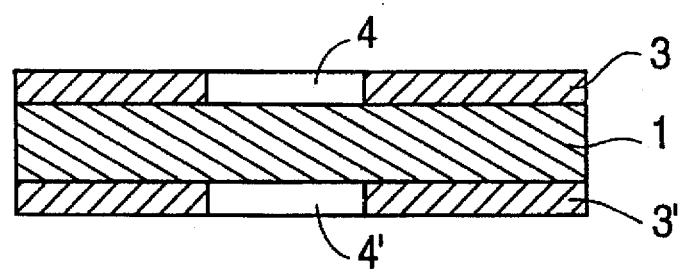

FIG. 3b shows the plastic film after coating on both sides with photoresist coatings 3 and 3' applied by any known procedure. FIG. 3c shows the film after exposure and development of coatings 3, 3' with a desired hole pattern, leaving recesses 4 and 4' at those points where holes are to be formed. When through passages are to be formed, identically shaped recesses are formed in the coatings at opposite sides of the film. The exposure and development is done by known techniques such as UV exposure and subsequent development. The plastic film then has on both sides a patterned photoresist coating in which the pattern corresponds to the desired hole pattern and which serves as an etch resist for the subsequent hole etching process.

Figure 3D:
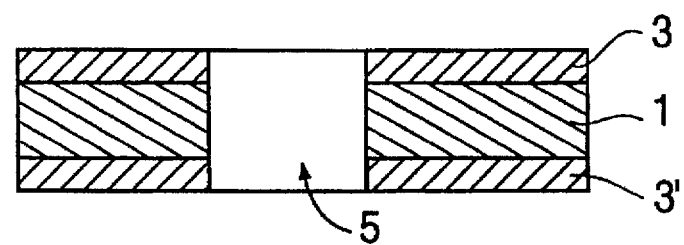

FIG. 3d shows plastic film 1 after etching passage 5 using a wet chemical or plasma etching process, giving a burr-free passage. Again, if anisotropic plasma etching is used, underetching is avoided. If the selected etch resist is merely more etch-resistant than the plastic film, some material removal from the etch resist also takes place, leaving the remaining etch resist thinner than before. If the coating thickness of film 1 is not to be attacked or reduced, then the coating thickness and the etching resistance of the etch resist must be correspondingly selected. If the remaining etch resist is prejudicial to subsequent processing or use of the film, it can be removed in an additional conventional step. It is possible for etching of the passages and the removal of the photoresist or etch resist to take place in a single operation.

Figure 4:
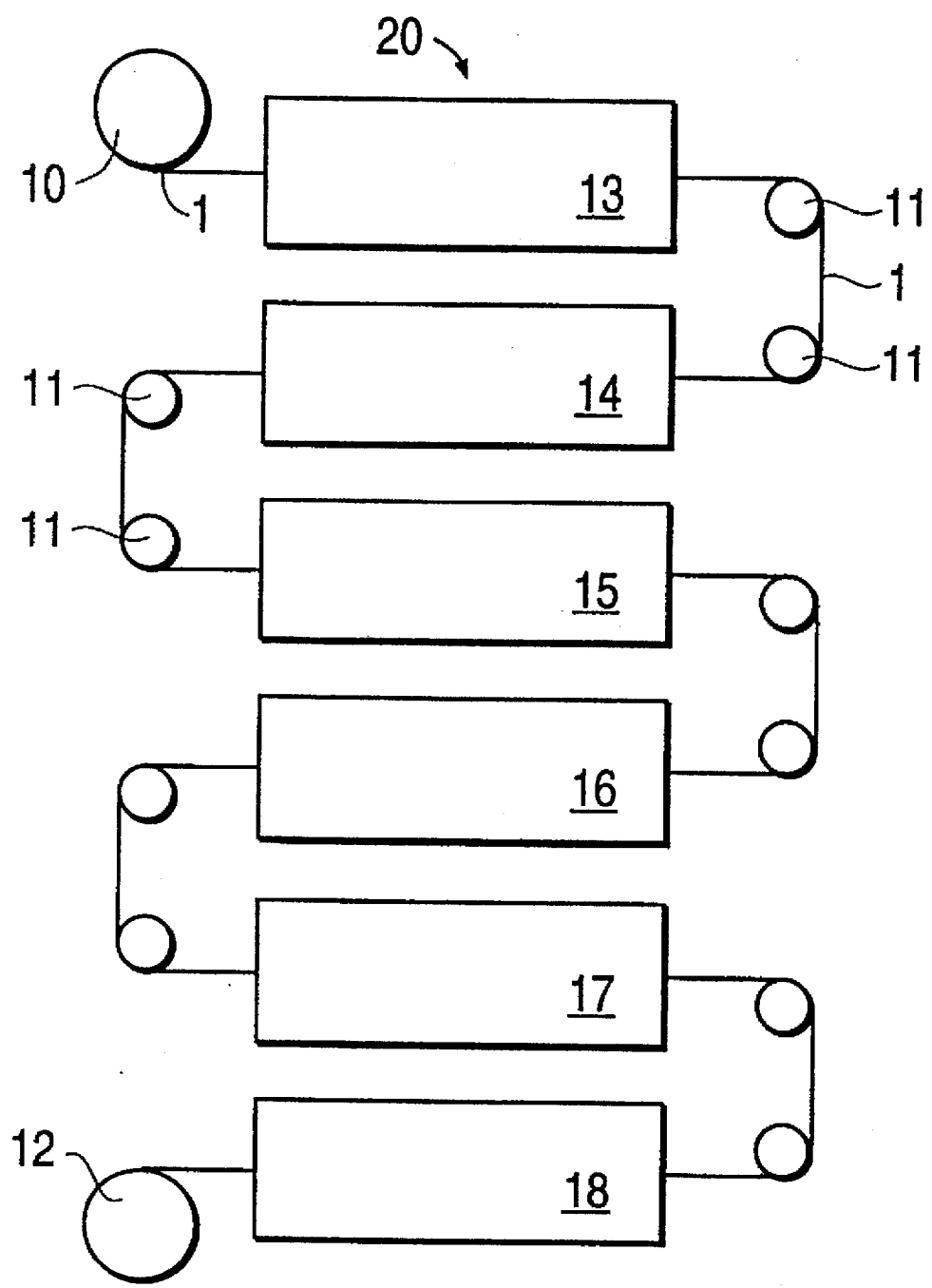
FIG. 4 is a schematic diagram illustrating a process for forming holes in a strip plastic film material of indeterminate length.

FIG. 4 shows a process for producing holes in plastic film in a continuous type process in a strip installation. The advantage of the continuous process is that strip can be processed from roll to roll. The etching of holes in plastic films coated on both sides, as discussed above, can be done with a strip installation of this type.

Metal coated plastic film 1 is supplied from a supply roll 10, passes through various process stages and steps and is ultimately wound up on a take-up roll 12 as a finished product comprising perforated film. A first process stage is a roller coater 13 in which the plastic film is coated on both sides with photoresist coatings 3, 3'. The coatings are dried in a continuous furnace 14 and are exposed in a UV exposure stage 15 to form the hole pattern in the coatings, the pattern being developed in a developing installation 16. In a metal etching and photoresist stripping stage 17, etching of metal coatings 2, 2' takes place first at the locations of recesses 4, 4' where passages 5 or holes 6 are to be formed, followed by removal of remaining photoresist. Etching out of the passages and holes then takes place in a plasma reactor 18.

Further process stages can also be added to an installation such as that shown in FIG. 4 for coating the plastic film with metal in which case the film on supply roll 10 would be plastic only.

Figure 5:
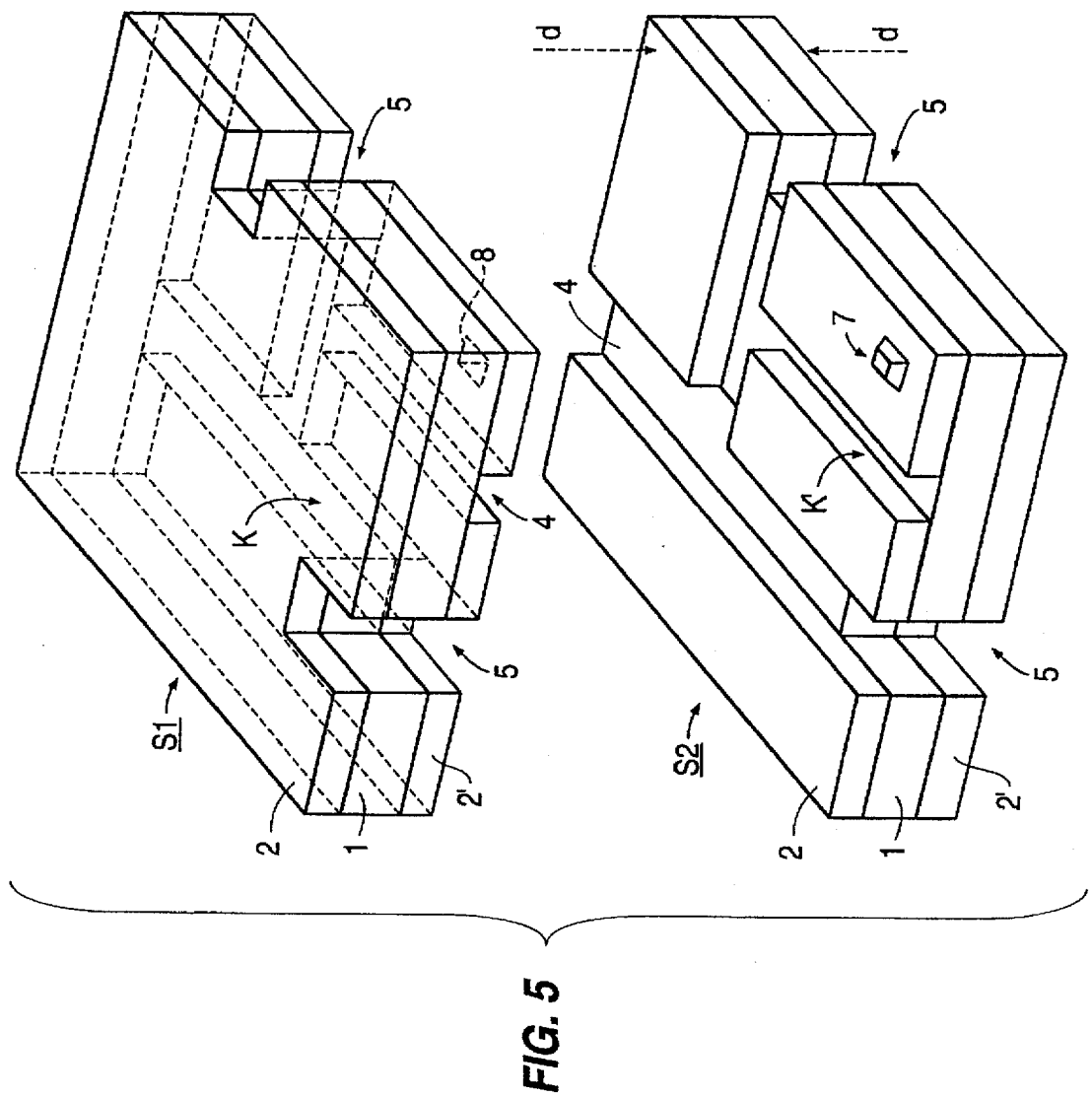
FIG. 5 is a perspective, exploded view of a laminated structure in accordance with the invention having channels therein.
Figure 6:
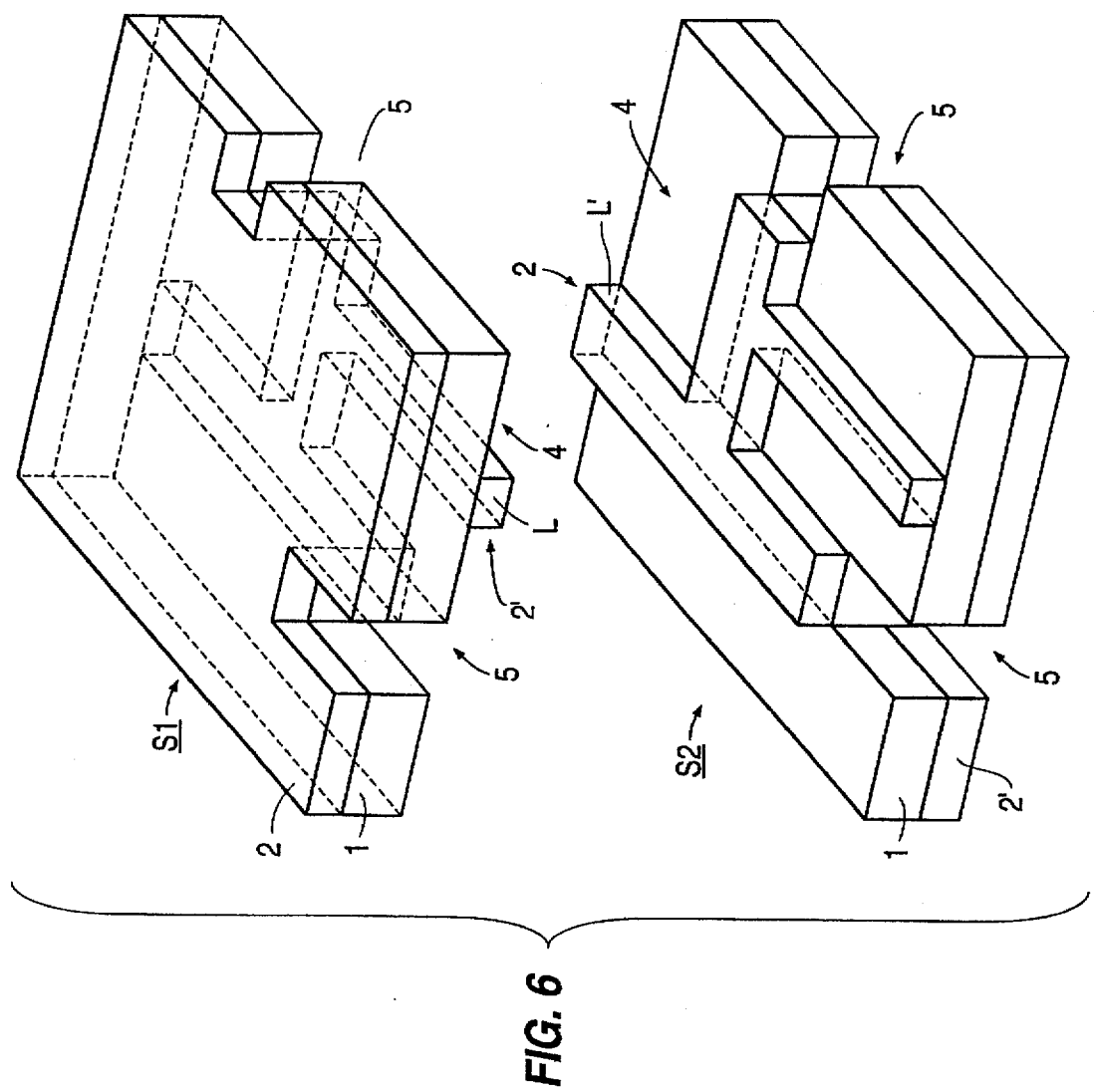
FIG. 6 is a perspective exploded view of a laminated structure in accordance with the invention having conductive paths formed therein.

FIGS. 5 and 6 show in a very simplified manner examples of the formation of microscreen stacks or assemblies which result in diaphragms with tubular conduits (FIG. 5) and multilayers with solid conduits (FIG. 6). For purposes of simple illustration and to show that the same technology in negative and positive representation leads either to a diaphragm or to a multilayer, the same arrangement has been used in both drawings for the channels and conducting paths, and the reference numerals are based on FIGS. 1a to 3d.

FIG. 5 shows two matched microscreens S1 and S2 each having passages 5 in the Z direction and a tubular passage system 4 elongated in the X-Y plane, passage system 4 being in communication with passages 5. Each microscreen includes the basic elements discussed earlier, namely a central plastic film 1 and coatings 2, 2' on opposite sides of the film. The tubular system is formed by the formation of recesses 4 and 4' as shown in the earlier figures and the microscreens can have such recesses and tubular systems on both sides. This possibility has not been shown so as to avoid complicating the illustrations. Also, it should be recognized that a realistic assembly of such microscreens would be expected to have many more layers such as S1 and S2.

If microscreens S1 and S2 are now placed together, the result is a system of channels K in the X, Y and Z directions. The placement of the channels in this illustration is purely arbitrary but demonstrates the principle. In place of a homologous construction with channels having twice the cross-section of the recesses, structurally identical microscreens can be stacked on one another using, for example, a coating 2' with recesses 4 and a coating 2 on the adjacent element with no such recesses. In this embodiment there is only correspondence of the Z conduits 5 in the microscreen assembly. Using a strip production process such as shown in FIG. 4, it is possible to produce microscreens for multilayer assemblies at a high production rate.

FIG. 6 shows two further matched microscreens S3 and S4 with passages 5 and a conductor system L. The conductor system is formed by recesses 4, 4'. Passages 5 correspond to an interfacial connection as is conventional with multilayers. When the parts S3 and S4 are placed on each other, the result is a system of means defining conductors L in the X, Y and Z directions. The arrangement of the conductors is based on FIG. 5 in order to show the negative and positive aspects of the arrangement. Here again, in place of a homologous arrangement, which would lead to conductors with double cross-section, structurally identical microscreens can be stacked on each other, one having a coating 2' with recesses 4 and the other having a coating 2 with no corresponding recesses. In such an embodiment, only the Z conduits correspond in the assembly.

For stacking microscreens to form composites or assemblies, various procedures can be used. At some stage of the production of the individual microscreens, guide pins 7 and corresponding depressions 8 are formed on upper and lower surfaces of the outermost layers using conventional techniques. The guide pins and depressions are accurately positioned relative to the passages and conductor locations discussed above so that when two or more microscreens are stacked as indicated in FIGS. 5 and 6, the guide pins and depressions mate with each other and precisely center the microscreens, assuring that the passages therein are precisely aligned. Stacking can take place automatically under the control of optical marks placed on the microscreen outer surfaces or manually by mounting the microscreens in a common frame. In the assembled position with the alignment proper, the microscreens are interconnected. The connection can be done by chemical partial dissolving of the surfaces using suitable solvents or their vapors or, in the case of thermoplastics, by heat.

When partly hardened films are used, microscreens with hollow conduits are directly positioned on each other, centered and, accompanied by a heat supply, are compressed and cured. During stacking, an uncoated side without conduits is always placed on a coated side with conduits. If both sides are coated and provided with a mask, then adhesives are used. For this purpose, numerous suitable adhesives exist. If the microscreens being assembled have hollow conduits, it must be assured, of course, that the conduits are not blocked by adhesive. When forming diaphragms, it is advantageous to provide intermediate layers with openings only in the Z direction through which channels extending in X and Y directions can be interconnected. Such intermediate layers are preferably produced with partly hardened films because bonding with heat only greatly reduces the probability of uncontrolled sealing of channels.

A "mixed structure" with a combination of tubular hollow conduits and solid conduits is possible. It must be borne in mind that the structures disclosed herein are made in the field of microtechnology involving the microranges mentioned above. As an example, the thickness dimension d—d in FIG. 5 is in the range of 20–50 μm which permits very great density of openings and conduits. The possible complexity of such composites is enormous as will be recognized from the fact that more than 25 microscreens can be assembled into a composite having a thickness of only 1 mm.

Figure 7:
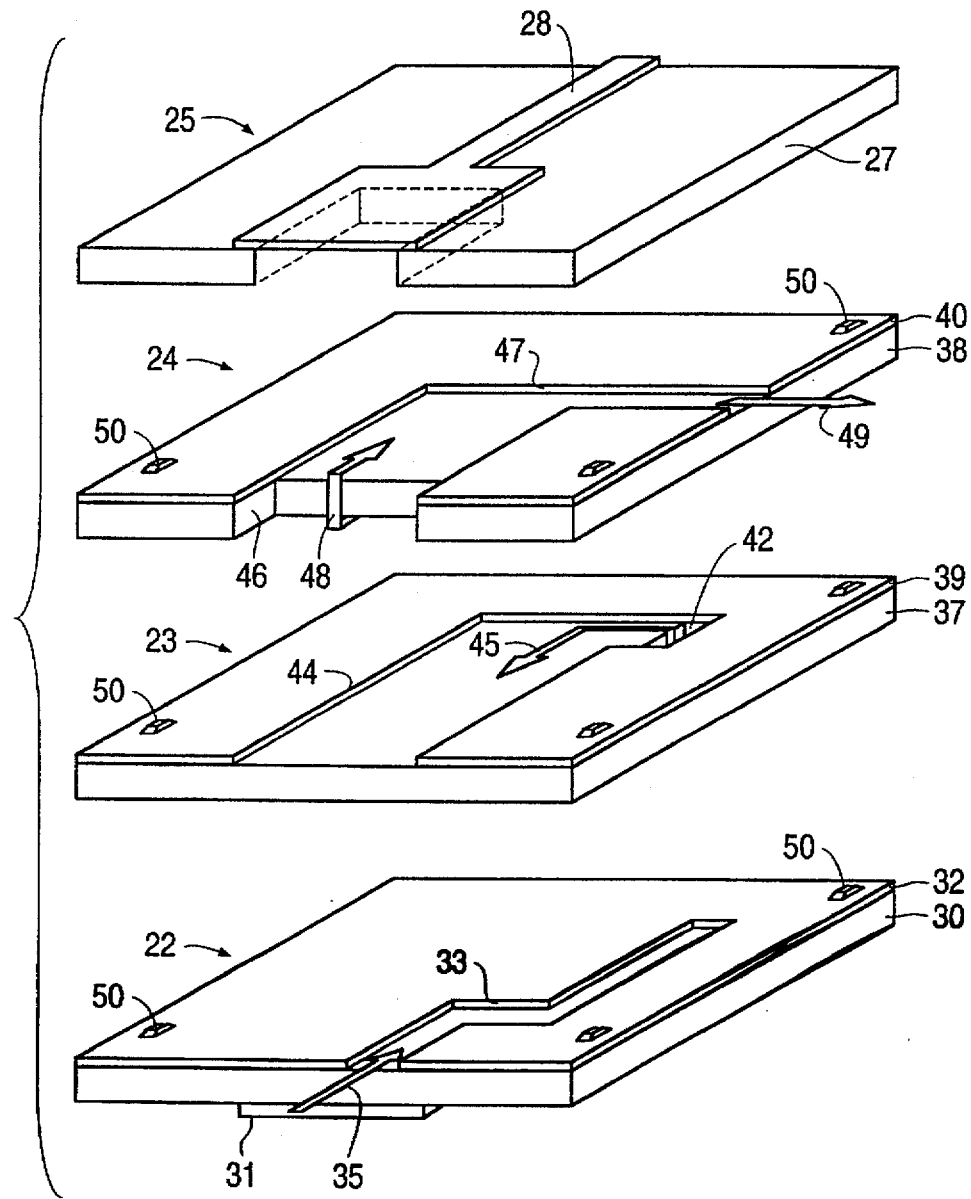
FIG. 7 is an exploded, perspective view of pre-laminates for a fluid conducting system in accordance with the invention with electrically conductive layers.
Figure 8:
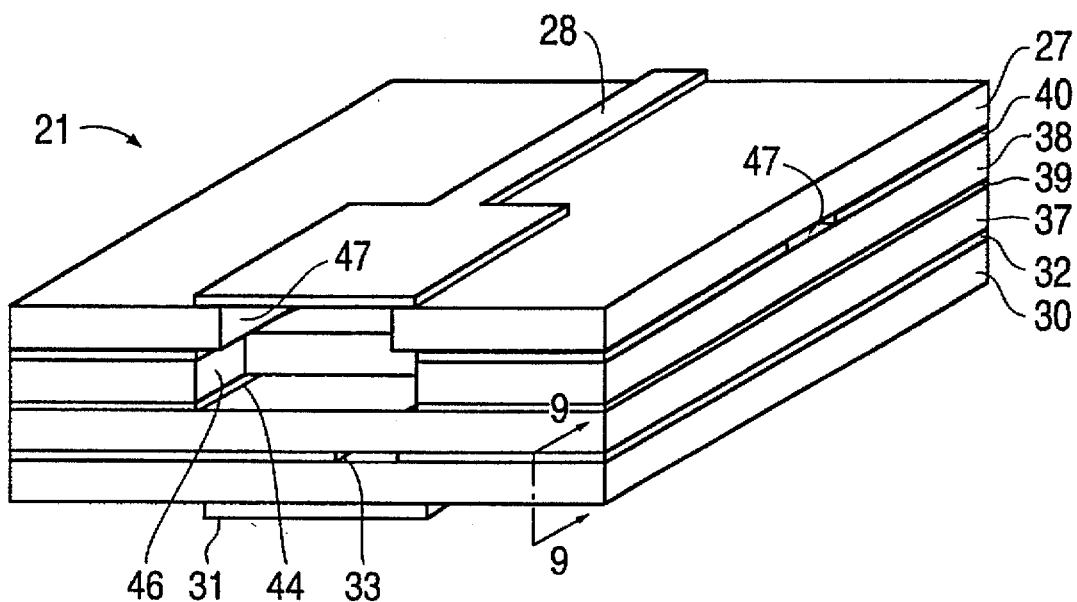
FIG. 8 is a perspective view of a body formed by assembly of the pre-laminate layers of FIG. 7.
Figure 9:
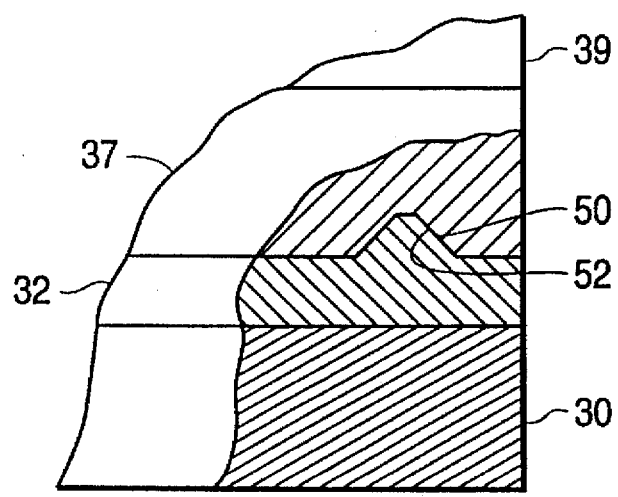
FIG. 9 is an enlarged detail, partly in section, along line 9—9 of FIG. 8.

A further example is shown in FIGS. 7–9 wherein the composite body has a continuous path for a fluid (liquid or gas) and layers in the laminate which are capable of interacting with the fluid as it is passed through the layers. FIG. 7 is an exploded view of the composite body and FIG. 8 shows the body in an assembled state. It will be appreciated that these figures show a very small body with a simple set of layers and a simple kind of interaction, but that this concept can be expanded to form bodies having much greater lateral dimensions in the X and Y directions, the dimension in the Z direction (thickness) being in the order of 0.2 to 0.3 mm.

The body 21 of FIGS. 7 and 8 includes four separate "pre-laminates" 22, 23, 24 and 25 which can be formed separately and then adhered together to form the body. In the example shown, the top pre-laminate 25 comprises a layer 27 of polyamide with a layer 28 of metal formed on or bonded to its upper surface. Layer 28 comprises conductive has been etched to leave a structure to perform the functions of a sensor, such as an electrode, and can be connected to a source of power, not shown, in any conventional fashion. As mentioned above, a sensor can also be a photo-optical element, guiding light. The bottom pre-laminate 22 comprises a layer of a polyamide 30 with a layer of metal 31 formed on or bonded to its lower surface and a layer of metal or other material 32 formed on or bonded to its upper surface. Layer 30 also comprises conductive means which has also been etched to form an electrode having the same shape as layer 28. Layer 32 has been etched to form a canal 33 therein which, when placed against the bottom surface of pre-laminate 23, will constitute a channel capable of carrying and confining fluid. For purposes of this example, it will be assumed that fluid will enter the channel as shown by arrow 35.

Intermediate pre-laminates 23 and 24 are structurally similar, each having a polyamide layer 37, 38 and a thinner layer 39, 40 of metal or other material. Layers 37 and 39 are provided with means defining an etched opening 42 therethrough in the Z direction, layer 39 also being etched to form a canal 44. Opening 42 is positioned at the inner end of canal 44 above the inner end of canal 33 so that fluid entering canal 33 as indicated by arrow 35 can flow upwardly through the opening and into canal 44 as indicated by arrow 45.

Layer 38 of pre-laminate 24 has means defining a notch 46 formed in one side thereof and layer 40 has a canal 47 formed therein so that fluid can flow around the edge of layer 38 at the notch and into canal 47 as shown by arrow 48. Fluid exits canal 47 as indicated by arrow 49. It will be assumed that the body as shown in FIG. 8 is part of a larger structure and that walls with suitable ports are in a sealing relationship against the exposed sides of the body to confine and control the low of fluids, such walls being omitted so that the arrangements of parts of the body can be seen clearly.

The top of each of layers 32, 39 and 40 is provided with a plurality of shaped protrusions 50 which are shown as small pyramids. Although three are shown on each pre-laminate, other numbers can be chosen depending upon the size and other characteristics of the materials. Mating recesses 52 are formed in the bottom surfaces of layers 27, 37 and 38 and are located to receive protrusions 50 essentially as shown in the enlarged section view of FIG. 9 forming means for assembling the pre-laminates in precise relative positions for desired alignment of the canals and openings. This mating relationship accurately positions the pre-laminates relative to each other so that openings and canals such as 33, 42 and 44 are properly aligned to carry fluid in a predetermined manner when the pre-laminates are assembled into a body as shown in FIG. 8.

Although layers 30, 37, 38 and 27 are described as polyamides, they can be selected to be different polyamides with different characteristics so that selected layers can interact with the fluids, or can be coated to so interact. Selected ones of layers 32, 39 and 40 can be other synthetic materials or metals to cooperate with the electrodes to affect the fluids, thereby permitting physical and\or chemical treatment of the fluid in a controlled manner as the fluid passes through the body. In addition, as discussed in connection with the earlier figures, the openings in the z direction can be plated or otherwise coated with conductive material to interconnect electrically metal layers on the major surfaces of the pre-laminates so that assembly of plural layers joins conductive portions to form complete and continuous conductive paths through plural layers of the body. In addition, the dimensions of the canals can be selected to control flow rates through various parts of the body, thereby selecting residence times of the fluid in each part of the body.

It should be emphasized that the thickness of each pre-laminate is preferably in the range of about 20 to 40 microns so that the entire body is held to significantly less than 0.5 mm, although thicknesses have been exaggerated in the illustrations for clarity.

What is claimed is:

1. A multilayer laminated body having a determinate system of hollow passages, the body comprising
    an assembly of a plurality of substantially flat layers of polymeric materials having major dimensions in orthogonal X and Y directions and a thickness dimension in a Z direction perpendicular to said X and Y directions, selected ones of said layers having means defining openings extending therethrough in said Z direction,
    selected ones of said layers having canals formed therein in an X-Y plane,
        said openings and canals forming parts of hollow passages so that assembly of plural layers joins said openings and canals in a plurality of said layers to form complete and continuous passages through a plurality of said layers of said body, and
    means for assembling said layers in precise relative positions for desired alignment of said canals and openings.

2. A body according to claim 1 wherein each of said layers has a maximum thickness of 0.5 mm.

3. A body according to claim 2 and further comprising a conductive material in each of said passages forming conductive paths through said body.

4. A body according to claim 3 wherein said conductive material is electrically conductive.

5. A body according to claim 3 wherein said conductive material is optically conductive.

6. A multilayer laminated body having a determinate system of conductive passages, the body comprising
    an assembly of a plurality of substantially flat layers having major dimensions in orthogonal X and Y directions and a thickness dimension in a Z direction, selected ones of said layers each comprising
    a layer of polymeric material,
    means on at least one surface of said layer of polymeric material comprising a layer of a metal with portions thereof removed by etching to define electromagnetically conductive portions extending in an X-Y plane, and
    means defining openings formed by plasma etching through said polymeric material in said Z direction,
    said openings in said Z direction having conductive material therein interconnecting said conductive portions in said X-Y plane with conductive portions on adjacent layers so that assembly of plural layers joins said conductive portions to form complete and continuous conductive paths through plural layers of said body; and
    means on said layers for assembling said layers in precise relative positions for desired alignment of said canals and openings.

7. A body according to claim 6 wherein said polymeric material in each of said layers has a maximum thickness of 0.5 mm.

8. A multilayer laminated body having a determinate system of hollow passages, the body comprising an assembly of a plurality of substantially flat layers each having major dimensions in orthogonal X and Y directions and a thickness dimension in a Z direction perpendicular to said X and Y directions, selected ones of said layers each comprising a layer of polymeric material, means on one surface of said layer of polymeric material comprising a layer of a metal with portions thereof removed by etching to define hollow path portions extending in an X-Y plane, and means defining openings formed by plasma etching through said polymeric material in said Z direction interconnecting said hollow path portions, so that assembly of plural ones of said selected layers joins said path portions to each other to form complete and continuous hollow paths through said body.

9. A body according to claim 8 and further comprising a conductive material in each of said passages forming conductive paths through said body.

10. A body according to claim 9 wherein said conductive material is optically conductive.

11. A body according to claim 1 wherein said openings in said polymeric material are formed by plasma etching.

12. A multilayer laminated body having a determinate system of hollow passages, the body comprising an assembly of a plurality of substantially flat prelaminates of polymeric materials having major dimensions in orthogonal X and Y directions and a thickness dimension in a Z direction perpendicular to said X and Y directions, selected ones of said prelaminates having means defining openings extending therethrough in said Z direction, selected ones of said prelaminates having canals formed therein in an X-Y plane, said openings and canals forming parts of hollow passages so that assembly of plural prelaminates joins said openings and canals in a plurality of said layers to form complete and continuous passages through a plurality of said prelaminates of said body, and means on said prelaminates for assembling said prelaminates with each other in precise relative positions for desired alignment of said canals and openings.

13. A body according to claim 8 and further comprising means on said layers for assembling said layers in precise relative positions for desired alignment of said canals and openings.

* * * * *